(12) United States Patent
Choi et al.

(10) Patent No.: US 6,340,625 B1
(45) Date of Patent: Jan. 22, 2002

(54) METHOD FOR SIMULTANEOUSLY FORMING THINNER AND THICKER PARTS OF A DUAL OXIDE LAYER HAVING VARYING THICKNESSES

(75) Inventors: Sang Kook Choi; Kyung Hawn Cho; Won Sik An; Chung Hwan Kwon, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/497,687

(22) Filed: Feb. 4, 2000

Related U.S. Application Data

(62) Division of application No. 09/135,555, filed on Aug. 18, 1998, now Pat. No. 6,207,588.

(30) Foreign Application Priority Data

Oct. 17, 1997 (KR) ............................................. 97-53362

(51) Int. Cl.⁷ ........................... H01L 21/30; H01L 21/31
(52) U.S. Cl. ........................ 438/459; 438/981; 438/770; 438/757; 438/427
(58) Field of Search .......................... 438/981, 770–773, 438/775, 459, 243–249, 270, 296, 386–392, 424–428, 434–438, 704, 757

(56) References Cited

U.S. PATENT DOCUMENTS 5,486,266 A * 1/1996 Tsai et al. ................. 156/657.1
5,550,075 A * 8/1996 Hsu et al. .................... 438/981

FOREIGN PATENT DOCUMENTS

JP 402307277 * 12/1990 ......... H01L/29/792

* cited by examiner

Primary Examiner—Charles Bowers
Assistant Examiner—Thanh Nguyen
(74) Attorney, Agent, or Firm—Volentine Francos, PLLC

(57) ABSTRACT

A method for forming a dual oxide layer on a silicon substrate provides that layer having varying thicknesses by using a damage layer formed on the silicon substrate, or a silicon nitride layer deposited on the silicon substrate. The damage layer is formed on the silicon substrate by dry etching a designated part of the silicon substrate, and the dual oxide layer is formed by using the properties of $SiO_2$ by which the oxide layer growth speed on the damage layer is slower than that on the silicon substrate. A pattern of the damage layer is defined by photolithography, and the damage layer having a depth of about 20 to 5,000 Å is formed using $CF_4$, $CHF_3$, or Ar gas at a pressure of 900 mTorr or less, or using $Cl_2$ or HBr. In the preoxidation cleaning step, a solution containing $NH_4F$, HF, and $H_2O$, a standard solution containing $NH_4OH$, $H_2O_2$, and $H_2O$, and/or HF are used. Meanwhile, using the nitride layer, after depositing the silicon nitride to a thickness of about 10 to about 100 Å on the silicon substrate, a pattern of the silicon nitride layer is defined by photolithography and the silicon nitride layer is partially removed depending on the pattern.

8 Claims, 9 Drawing Sheets

METHOD FOR SIMULTANEOUSLY FORMING THINNER AND THICKER PARTS OF A DUAL OXIDE LAYER HAVING VARYING THICKNESSES

CROSS REFERENCE TO RELATED APPLICATIONS

This is a divisional application of application Ser. No. 09/135,555, filed Aug. 18, 1998 now U.S. Pat. No. 6,207,588, which is hereby incorporated by reference in its entirety for all purposes.

BACKGROUND OF THE INVENTION

1. Field of the Invention

The present invention generally relates to a method for forming a dual oxide layer, and more particularly to a method for forming a dual oxide layer having varying thicknesses by using a damage layer formed on the silicon substrate by dry etching, or a silicon nitride layer deposited on the silicon substrate.

2. Background of the Related Art

In the semiconductor industry, silicon dioxide ($SiO_2$) is used in a variety of applications. Often, it is used as a dielectric or an insulative layer to electrically separate various regions or structures. Examples of use as a dielectric or an insulative layer include as a gate oxide on a MOS (Metal Oxide Semiconductor) device, as a dielectric of a capacitor, as an interlevel dielectric between metals, and for a field isolation.

When used as a gate oxide on a MOS device, the $SiO_2$ layer needs to have excellent electrical characteristics. Particularly, as the mounting density of the semiconductor chip on the substrate has been improved, the thickness of the oxide layer has decreased, and the need for a gate oxide having excellent electrical characteristics and a thickness of 100 Å or less has arisen.

As the operational speed of electrical systems has increased, a merged IC, comprising a logic device, SRAM (Static Random Access Memory), DRAM (Dynamic RAM), and ROM (Read Only Memory) within one single chip, has been developed. Since each of the individual devices within the merged IC has a different operational speed and driving condition, each device requires a certain oxide layer thickness. This oxide layer, which has these varying thicknesses, is hereinafter referred to as a "dual oxide layer", and is particularly used where an oxide layer with excellent electrical characteristics is required. For example, a merged IC, comprising a memory device and a logic device such as a microprocessor within one single chip, requires a dual oxide layer having excellent uniformity and a thickness of 100 Å or less. This requirement of a dual oxide layer also applies to microprocessors, such as the CPU of a computer system, having an operational speed of 700 MHZ or more.

In the dual oxide layer, a relatively thick part may be used as the gate oxide of a DRAM memory cell transistor. Since a voltage higher than a positive power supply voltage ($V_{cc}$) (for example, $V_{cc}$+2Vth, wherein Vth is a threshold voltage of the memory cell transistor) is provided to a gate electrode so as to drive word lines, the part having the greater thickness is used as the gate oxide of the DRAM.

The need for another oxide layer growth process to form the dual oxide layer is a very complicated procedure, resulting in reduced productivity of the procedure. Further, interaction among the oxide layer growth processes on one wafer makes it difficult to form the dual oxide layer having the designated thickness at a predetermined position. This interaction among the oxide layer growth processes is most severe during formation of an ultra thin dual oxide layer.

Accordingly, a need exists for a process to form the dual oxide layer using only one oxidation process.

SUMMARY OF THE INVENTION

Accordingly, an object of the present invention is to provide a method for forming a dual oxide layer having excellent thickness uniformity on a wafer using only one oxidation process.

Another object of the present invention is to provide a method for forming a dual oxide layer having enhanced electrical characteristics as well as a thickness of 100 Å or less.

Still another object of the present invention is to improve the productivity of merged IC devices by simplifying the procedure for forming a dual oxide layer.

To achieve these and other objects, in a first embodiment of the present invention, a damage layer is formed on the silicon substrate by dry etching a designated part of the silicon substrate, and a dual oxide layer is formed by using the properties of $SiO_2$ that the oxide layer growth speed on the damage layer is slower than that on the silicon substrate. A pattern of the damage layer is defined by photolithography, and the damage layer having a depth of about 20 to 5,000 Å is formed by dry etching using $CF_4$, $CHF_3$, or Ar gas at a low pressure of 900 mTorr or less, or by dry etching using $Cl_2$ or HBr.

In a preoxidation cleaning step for cleaning the substrate surface before forming the dual oxide layer on the silicon substrate on which the damage layer is formed, a solution, which contains $NH_4F$, HF, and $H_2O$, a standard solution which contains $NH_4OH$, $H_2O_2$, and $H_2O$, and/or HF are used. The oxidation method for growing the dual oxide layer may be ramping oxidation, pyrogenic wet oxidation, or HCl dry oxidation. The thickness of the dual oxide layer is determined by the depth of the damage layer, the preoxidation cleaning method, the oxidation method, etc.

In a second embodiment of the present invention, the dual oxide layer is formed by using the properties of $Si_3N_4$ that the oxide layer growth speed on the silicon nitride layer is slower than that on the silicon substrate. After depositing silicon nitride having a thickness of about 10 to 100 Å on the silicon substrate, a pattern of the silicon nitride layer is defined by photolithography and the silicon nitride layer is partially removed depending upon the pattern. After that, the silicon nitride layer is reduced to a thickness of about 3 to 50 Å by the preoxidation cleaning of the silicon substrate with a solution which contains $NH_4F$, HF, and $H_2O$, a standard solution, which contains $NH_4OH$, $H_2O_2$, and $H_2O$, and/or HF. Then the oxidation step for growing the dual oxide layer is carried out and thereby, a thinner part of the dual oxide layer is formed on the silicon nitride layer and a thicker part of the dual oxide layer is formed on the rest of the silicon substrate.

BRIEF DESCRIPTION OF THE ATTACHED DRAWINGS

These and various other features and advantages of the present invention will be readily understood with reference to the following detailed description taken in conjunction with the accompanying drawings, which are incorporated in and constitute a part of this specification, and wherein like reference numerals designate like structural elements, and, in which.

DETAILED DESCRIPTION OF PREFERRED EMBODIMENTS

Preferred embodiments of the present invention will be described below with reference to the accompanying drawings.

Figure 1:
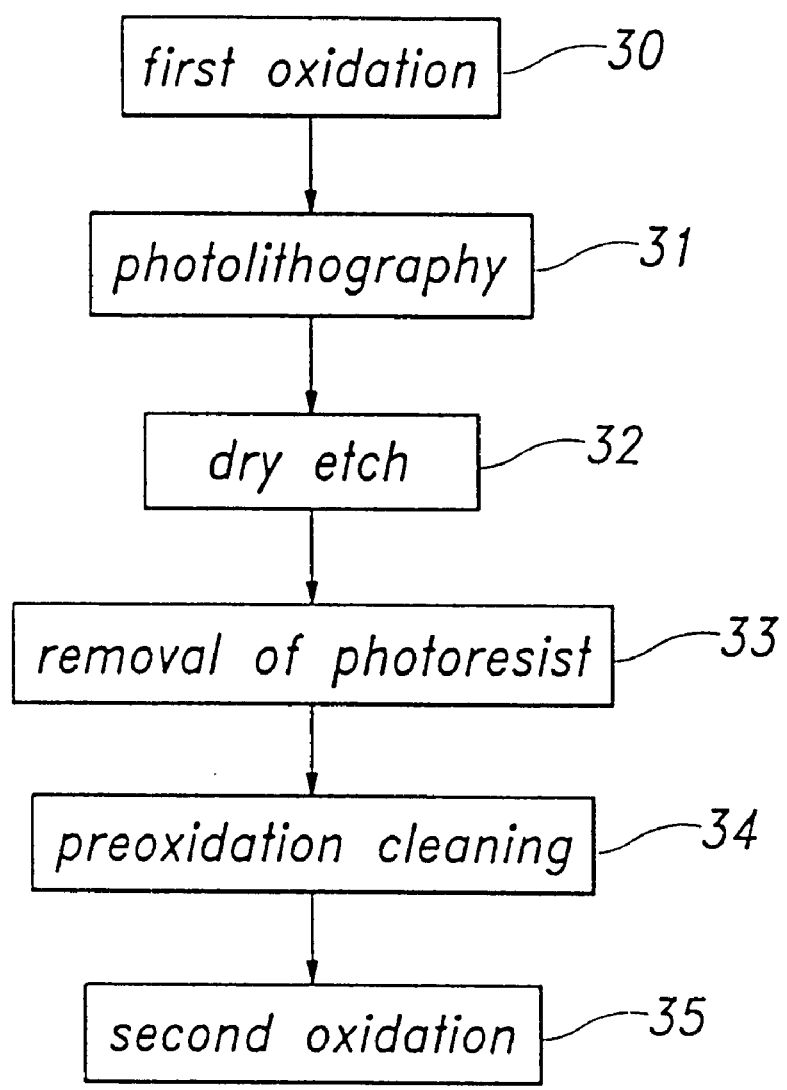
FIG. 1 is a flow chart showing a method for forming a dual oxide layer according to a first embodiment of the present invention.

FIG. 1 is a flow chart showing a method for forming a dual oxide layer according to a first embodiment of the present invention, and FIG. 2A through FIG. 2E depict various steps in the method for forming the dual oxide layer according to this embodiment. With reference to FIG. 1 and FIGS. 2A through 2E, the first embodiment of the present invention will be described as follows.

Figure 2A:
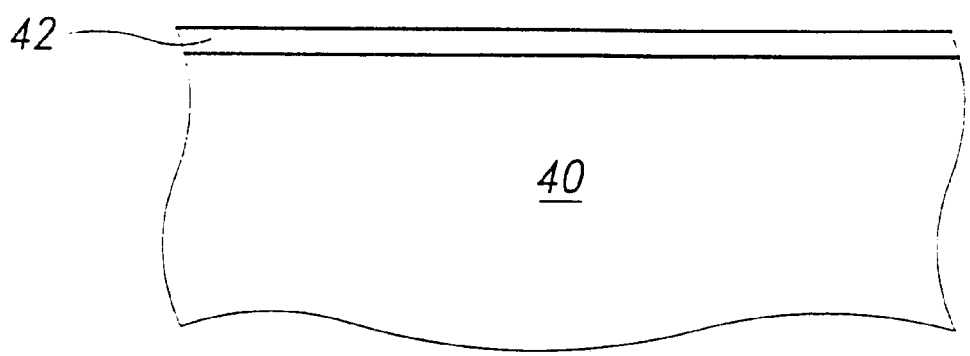
FIG. 2A through FIG. 2E are cross-sectional views depicting various steps in the method for forming the dual oxide layer according to the first embodiment of the present invention.

A first oxide layer 42 having a thickness of approximately 10 to 10,000 Å is formed on a silicon substrate 40 or a wafer surface (step 30 in FIG. 1, and FIG. 2A). The first oxide layer 42 is necessary to define an area, which will be a damage layer, on a surface of the silicon substrate 40. It is possible to define the area by using only a photoresist without forming the first oxide layer. However, it is preferable to use the first oxide layer, because when only the photoresist is used, no buffer layer is formed on the surface of the substrate, and an area of the silicon substrate other than the damage layer may be damaged. Meanwhile, instead of the oxide layer, a crystallized silicon or a silicon nitride layer may be used in the first oxide layer growth step 30.

Figure 2B:
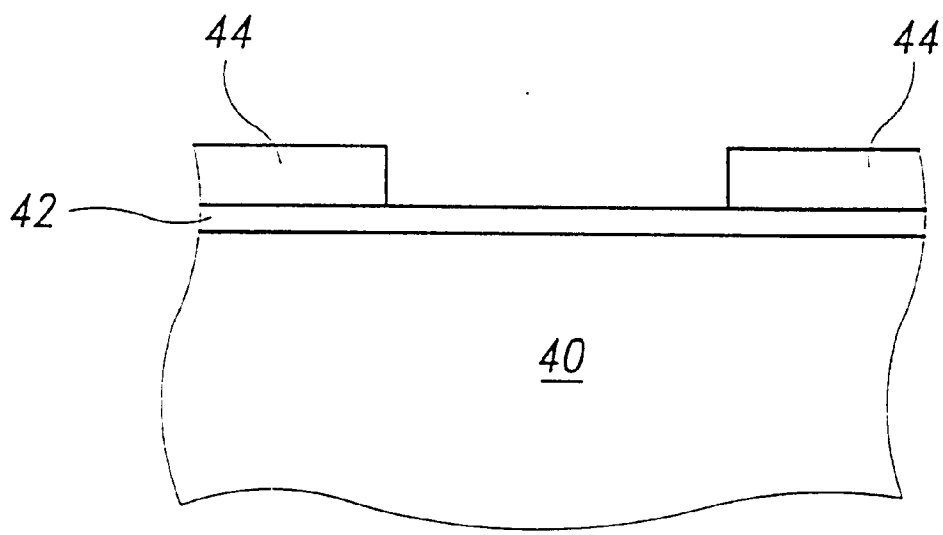
Figure 2C:
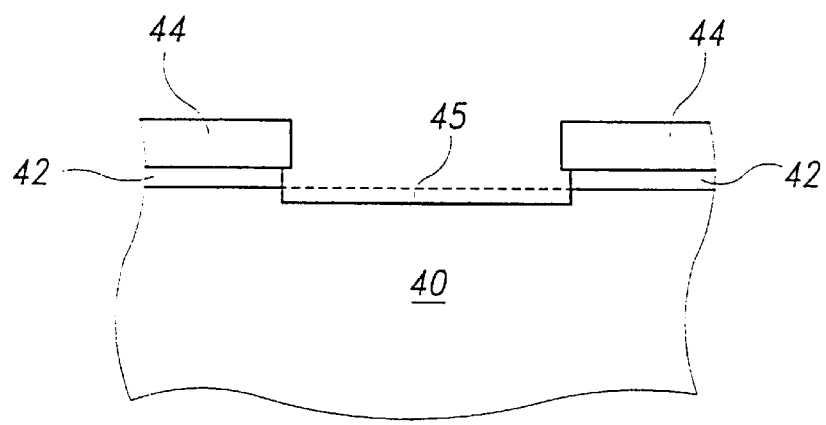

Next, the photoresist 44 is deposited on the first oxide layer 42 and a pattern of the photoresist 44 as shown in FIG. 2B is formed by exposing the photoresist 44 to light and developing the photoresist 44 by photolithography using a photo mask, on which a pattern corresponding to the damage layer is formed (step 31 in FIG. 1, and FIG. 2B). A part of the first oxide layer 42, the part which is exposed to light by the pattern of the photoresist, is removed and a damage layer 45 is formed on the removed part as shown in FIG. 2C using the dry etch method (step 32 in FIG. 1). At this time, the damage layer 45 extends below the original top surface of the silicon substrate 40, and the dry etch uses $CF_4$, $CHF_3$, or Ar gas under a low pressure of 900 mTorr or less, or uses $Cl_2$ or HBr. In the dry etch method, $CF_4$ or $CHF_3$ is dissolved and reacts with silicon (Si) of the substrate to form Si—C bonds, with F remaining on the silicon of the substrate. Thereby, the damage layer 45 is formed and has a depth of approximately 20 to 1,000 Å. The depth of the damage layer 45 is determined by the etch rate of the dry etch, which is conducted at step 32 in FIG. 1.

Figure 2D:
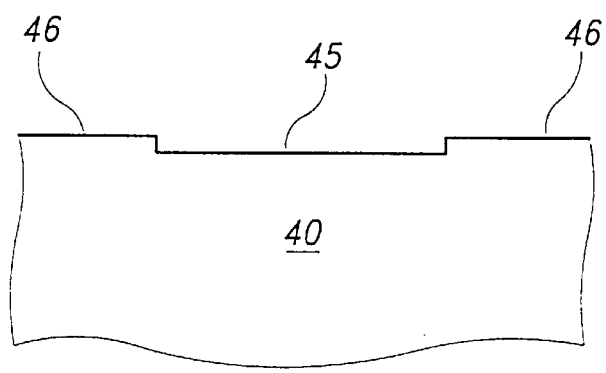

As can be seen in FIGS. 2C and 2D, steps are formed in the surface of the substrate 40 by the formation of the damage layer 45. Since the size of the step, that is, the depth of the damage layer 45, is controlled by the dry etch, it is possible to make advantageous use of the step. For example, a step which is formed at the boundary between parts of the oxide layer having different thicknesses is used as an alignment index in photolithography, or in case of a memory device, the step reduces the height difference between a core region, on which memory cells are formed, and a periphery region.

As shown in FIG. 2D, after throughly removing the residues of the photoresist and the first oxide layer from the surface of the substrate (step 33 in FIG. 1), a preoxidation cleaning of the surface of the substrate is carried out (step 34 in FIG. 1). The preoxidation cleaning removes organic or inorganic contaminants which remain on the surface of the substrate, before growing a second oxide layer on that surface. The preoxidation cleaning is a kind of a wet cleaning in which one or more compounds selected from HF, $NH_4F$, $NH_4OH$, $H_2O$, and $H_2O_2$ are used. As a cleaning solution which is used in the preoxidation cleaning step, LAL 500 which contains $NH_4F$, HF, and $H_2O$, and which has an etch rate of 500 µm/min, or Standard Cleaning (SC) Solution 1 which contains $NH_4OH$, $H_2O$, and $H_2O_2$, is used. HF may be added to the SC1 Solution or HF could replace the $H_2O$ in the solution. Since the preoxidation cleaning is performed after throughly removing the first oxide layer, the deterioration in the uniformity of the oxide layer may be prevented. The amount of the damage layer 45 which remains on the surface of the silicon substrate 40 varies depending on the degree of the preoxidation cleaning. Moreover, the degree of the preoxidation cleaning affects the oxide layer growth obstruction properties of the damage layer.

Figure 2E:
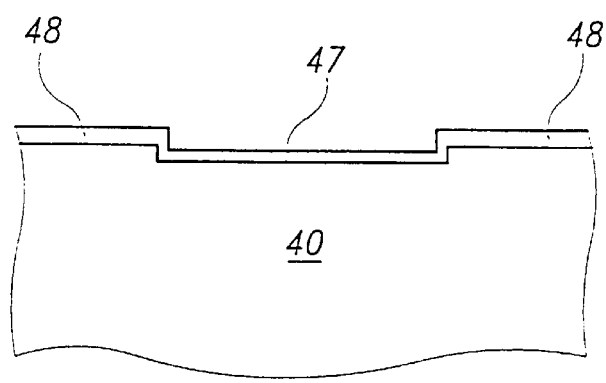

As shown in FIG. 2E, a second oxide layer 47, 48 is grown on the surface of the substrate 40 (step 35 in FIG. 1). Herein, on the area of substrate 40 where the damage layer is formed, the oxide layer growth speed decreases and a thinner part 47 is formed. On the areas of the substrate 40 where the damage layer was not formed, the oxide layer growth speed increases and a thicker part 48 is formed. That is, the dual oxide layer structure 47, 48 having different thicknesses is achieved. The thicknesses of the thinner part 47 and the thicker part 48 in the dual oxide layer are controlled by the oxidation method of the second oxide layer.

Generally, there are several oxidation methods for growing the oxide layer. The inventors of the present invention have used three (3) methods, that is, an $N_2$ Dilution Ramping Oxidation, a Pyrogenic Wet Oxidation, and a HCl Dry Oxidation.

The ramping oxidation method is the most advantageous method and comprises flowing oxygen ($O_2$) in nitrogen ($N_2$)

through a furnace and heating the wafer up to the oxidation temperature, so as to grow a very thin oxide layer having a thickness of 50 Å or less. The ramping oxidation method comprises a step of thermally treating the wafer at a high temperature (for example, 1050° C.) in nitrogen, and a step of gradually heating the wafer in the presence of dry oxygen. In the thermal treatment step, to flow oxygen gas 50% or less in nitrogen gas, or 100% oxygen gas is referred to as a "$O_2$ Ramping Oxidation". Herein, the amount of oxygen gas represents the percent of oxygen gas of the amount of total gas, and to use oxygen gas in an amount of 50% or less improves uniformity of the wafer, compared with the case of 100% oxygen gas. Note that argon (Ar) gas may be used instead of nitrogen ($N_2$) gas.

In the pyrogenic wet oxidation method, pure hydrogen ($H_2$) and oxygen ($O_2$) gas are directly supplied to the diffusion tube of the furnace, and vaporized $H_2O$ is obtained by incinerating the hydrogen and the oxygen in the diffusion tube. The oxide layer is grown by the vaporized $H_2O$. The pyrogenic wet oxidation method has an advantage in that it can employ various partial pressures of $H_2O$.

The HCl dry oxidation method uses oxygen ($O_2$) and HCl to grow the oxide layer. The HCl dry oxidation is a kind of halogenic oxidation, which improves the electrical characteristics of the oxide layer or Si beneath the oxide layer by adding halogen molecules during the dry oxidation step. The oxide layer, which is formed by the HCl dry oxidation, has excellent dielectric breakdown characteristics. During thermal oxidation, Cl is concentrated on the interface between the silicon (Si) and the silicon dioxide ($SiO_2$) and increases the life of the oxide layer by removing the impurities from the interface between the silicon and the silicon dioxide. Since Cl captures natrium ions ($Na^+$) at a temperature of 1060° C. or more, when the oxide layer formed by the HCl dry oxidation is used as the gate oxide layer of a MOS (Metal Oxide Semiconductor) device, the oxide layer has a very stable threshold voltage property.

Table 1 shows the thickness difference between the thinner part and the thicker part of the dual oxide layer according to the oxidation methods and the preoxidation cleaning methods.

TABLE 1

| | Oxide Layer Thickness | | | |
|---|---|---|---|---|
| Preoxidation Cleaning Method | Oxidation Method | Thickness of Thicker part of Oxide Layer | Thickness of Thinner part of Oxide Layer | Remarks |
| Omitted | Dilution Ramping Oxidation | 118.6Å | 19.5Å | |
| LAL500 + SC1 + HF | Dilution Ramping Oxidation | 128.8Å | 23.9Å | 5% $O_2$ |
| | Oxygen Ramping Oxidation | 120.0Å | 92.1Å | |
| | Pyrogenic Wet Oxidation | 123.8Å | 76.5Å | $H_2 + O_2$ |
| | HCl Dry Oxidation | 118.6Å | 118.9Å | 1% HCl |
| LAL500 + SC1 | Dilution Ramping Oxidation | 128.8Å | 24.4Å | 5% $O_2$ |
| | Oxygen Ramping Oxidation | 120.0Å | 64.2Å | |
| | Pyrogenic Wet Oxidation | 123.8Å | 74.5Å | $H_2 + O_2$ |

In Table 1, LAL 500=$NH_4F+HF+H_2O$, and SC1(standard cleaning solution 1)=$NH_4OH+H_2O+H_2O_2$. Also, the damage layer is formed so as to have a depth of approximately 100 Å. The conditions for forming the oxide layer are selected to yield a thickness of the thicker part of the dual oxide layer of 120 Å.

FIG. 3 through FIG. 6 are graphs of $\Delta T_{OX}$ versus depth of the damage layer, the degree of the preoxidation cleaning, the thickness of the oxide layer, and the amount of HCl used, respectively. Herein, $\Delta T_{OX}$ refers to the thickness difference between the thinner part and the thicker part of the dual oxide layer.

Figure 3:
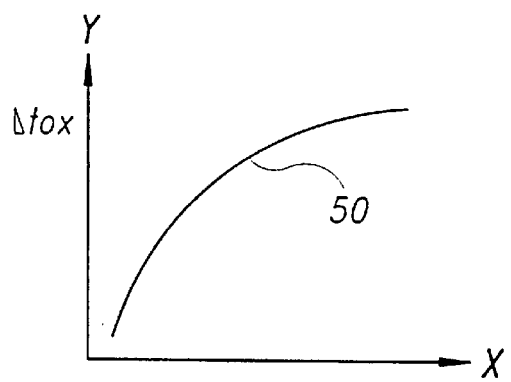
FIG. 3 is a graph showing $\Delta T_{OX}$ by the depth of a damage layer in the first embodiment of the present invention, where $\Delta T_{OX}$ represents the difference between the thickness of a thicker part and the thickness of a thinner part, in the dual oxide layer having varying thicknesses.

With reference to FIG. 3, the X-axis represents the depth of the damage layer and the Y-axis represents $\Delta T_{OX}$. As shown by curve 50, $\Delta T_{OX}$ is directly proportional to the square root of the depth of the damage layer. That is, if the damage layer extends deeply into the silicon substrate, the damage layer is severely damaged, and the oxide layer growth speed on the damage layer decreases. Therefore, $\Delta T_{OX}$, the thickness difference between the thicker oxide layer and the thinner oxide layer of the dual oxide layer becomes great. There is an upper limit on $\Delta T_{OX}$, so that even if the damage layer thickness exceeds a designated value, the upper limit on $\Delta T_{OX}$ will not be exceeded. This designated value of the thickness of the damage layer is not shown in the graph 50.

Figure 4:
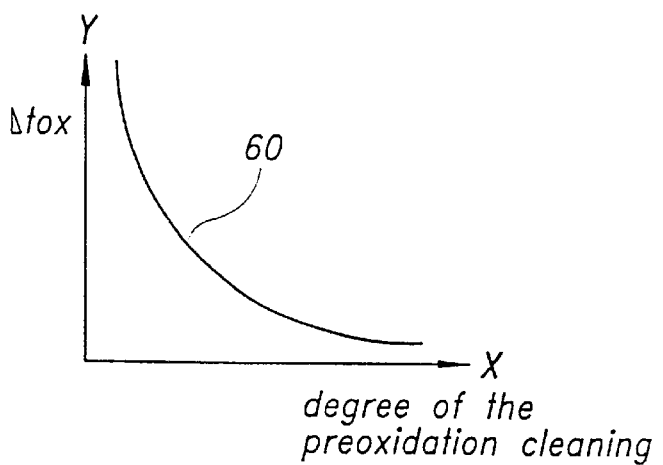
FIG. 4 is a graph showing $\Delta T_{OX}$ by the degree of a preoxidation cleaning in the first embodiment of the present invention.

In FIG. 4, the X-axis represents the degree of preoxidation cleaning and the Y-axis represents $\Delta T_{OX}$. Herein, the degree of preoxidation cleaning refers to the etch rate. As described above, the degree of preoxidation cleaning affects the remaining amount of the damage layer on the surface of the substrate. As shown by the curve 60 of FIG. 4, $\Delta T_{OX}$ is inversely proportional to the degree of preoxidation cleaning. Accordingly, the more preoxidation cleaning is carried out, the less damage layer remains on the silicon substrate.

Figure 5:
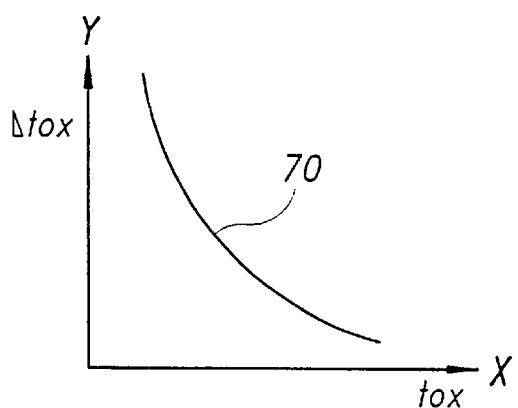
FIG. 5 is a graph showing $\Delta T_{OX}$ by the thickness of a normal oxide layer in the first embodiment of the present invention.

In FIG. 5, the X-axis represents the thickness of a normal oxide layer and the Y-axis represents $\Delta T_{OX}$. Herein, the thickness of the normal oxide layer corresponds to the thickness of the thicker part of the dual oxide layer and depends on the oxidation method of the second oxide layer and the conditions selected for forming the second oxide layer. As shown by the curve 70, the thicker the thickness of the normal oxide layer, the smaller the value of $\Delta T_{OX}$.

Figure 6:
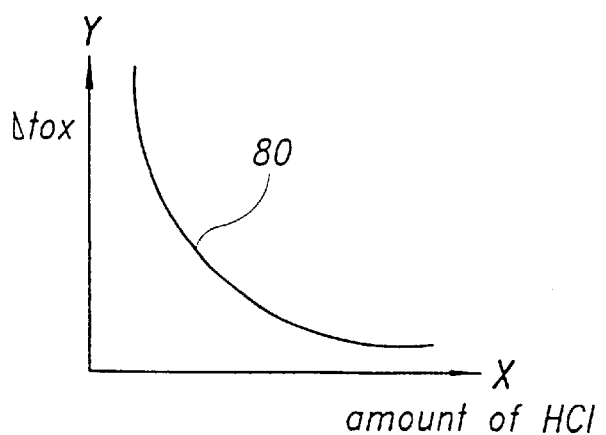
FIG. 6 is a graph showing $\Delta T_{OX}$ by the amount of HCl used in the first embodiment of the present invention.

FIG. 6 is a graph of $\Delta T_{OX}$ versus amount of HCl used in growing the second oxide layer. As shown by the curve 80, $\Delta T_{OX}$ is inversely proportional to the amount of HCl used.

As shown Table 1 above, in the case of using the dilution ramping oxidation method and omitting the preoxidation cleaning, the value of $\Delta T_{OX}$ is 99.1 Å (118.6−19.5=99.1 Å). Meanwhile, in the case of using the dilution ramping oxidation method and the preoxidation cleaning with LAL500+ SC1+HF as a cleaning solution, the value of $\Delta T_{OX}$ is 104.9 Å (128.8−23.9=104.9 Å). This fact does not correspond to the relation between the degree of preoxidation cleaning and $\Delta T_{OX}$. The reason is that $\Delta T_{OX}$ is inversely proportional to the thickness of the normal oxide layer as shown in FIG. 5. More specifically, the value of $\Delta T_{OX}$ of 99.1 Å is a result of the normal oxide layer having a thickness 118.6 Å, and the value of $\Delta T_{OX}$ of 104.9 Å is a result of the normal oxide layer having a thickness of 128.8 Å. From these results, it is understood that $\Delta T_{OX}$ is more affected by the thickness of the normal oxide layer than by the degree of preoxidation cleaning, when the second oxide layer is formed using dilution ramping oxidation.

As shown in Table 1 above, when HCl dry oxidation and preoxidation cleaning with LAL500+SC1+HF as the cleaning solution are used, $\Delta T_{OX}$ has a negative value. In HCl dry oxidation, if HCl in an amount of about 0.5% or more is used, $\Delta T_{OX}$ becomes smaller due to an effect caused by the HCl gas. At this time, the negative value of $\Delta T_{OX}$ is reported as an error, which is caused by a detector.

According to the above-described first embodiment of the present invention using the damage layer, since the photo mask is used only once in the step of defining the damage layer (step 31 in FIG. 1), the procedure may be simplified. Further, during the step of forming the second oxide layer, that is, the dual oxide layer, since no oxide layer remains on the surface of the silicon substrate, the thickness of the oxide layer is controlled regardless of the position on the wafer.

A second embodiment of the present invention uses the oxidation properties of silicon nitride ($Si_3N_4$). If silicon nitride is oxidized, an oxidized nitride ($SiO_xN_y$) layer is formed, and the oxidized nitride has the advantages of both an oxide layer and a nitride layer. The O/N ratio of the oxidized nitride layer is variable. Nitrogen ($N_2$) reduces the Si-O bonds and improves the surface condition while electrical stress is exerted on the oxidized nitride layer, while greatly reducing the hot electron effect. Therefore, the oxidized nitride layer is suitable for high integrity devices.

Methods for forming the oxidized nitride layer include a $Si_3N_4$ oxidation method, a $SiO_2$ nitridation method using $NH_3$, and a $SiO_xN_y$ direct growth method using nitrous oxide as oxidant species.

This embodiment of the present invention uses the $Si_3N_4$ oxidation method. Since the oxidation speed of the silicon nitride is much slower than that of the silicon, if the oxidation process is carried out after depositing the nitride layer on a certain part of the silicon substrate, a dual oxide layer having different thicknesses is formed.

The method for forming the dual oxide layer according to the second embodiment of the present invention is shown in the flow chart of FIG. 7, and FIG. 8A through FIG. 8F show cross-sectional views of the steps in the method.

Figure 7:
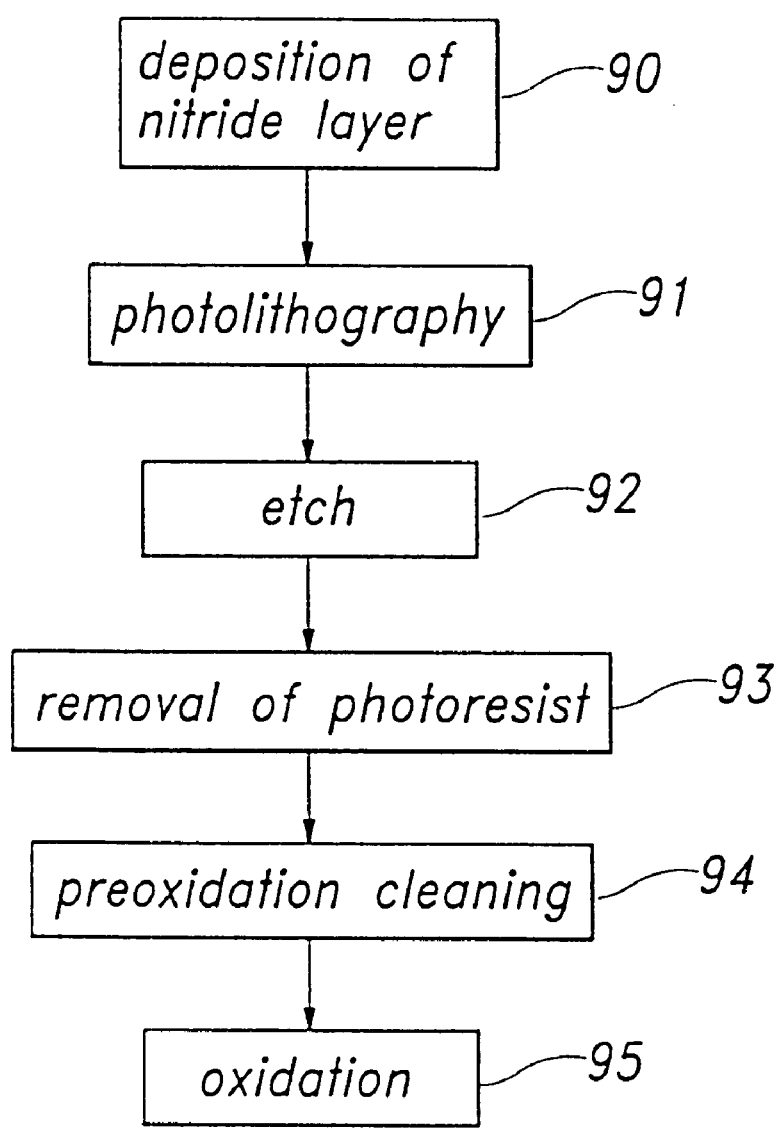
FIG. 7 is a flow chart showing a method for forming a dual oxide layer according to a second embodiment of the present invention.
Figure 8A:
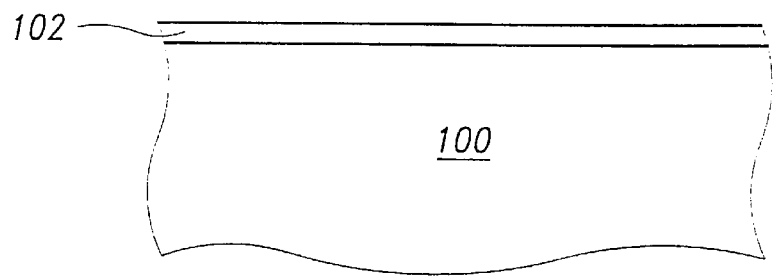
FIG. 8A through FIG. 8F are cross-sectional views depicting various steps in the method for forming the dual oxide layer according to the second embodiment of the present invention.

With reference to FIG. 7 and FIGS. 8A through 8F, a nitride layer 102 is deposited on a silicon substrate 100 (FIG. 8A, and step 90 in FIG. 7). The thickness of the nitride layer 102 is about 50 to 100 Å. However, the thickness of the nitride layer 102 determines the required etch rate of the subsequent etch process and the thickness of the oxide layer which is formed on the silicon substrate in the oxidation process. Therefore, the procedure may be simplified by properly controlling the thickness of the nitride layer 102 and forming the dual oxide layer with just one oxidation process.

Figure 8B:
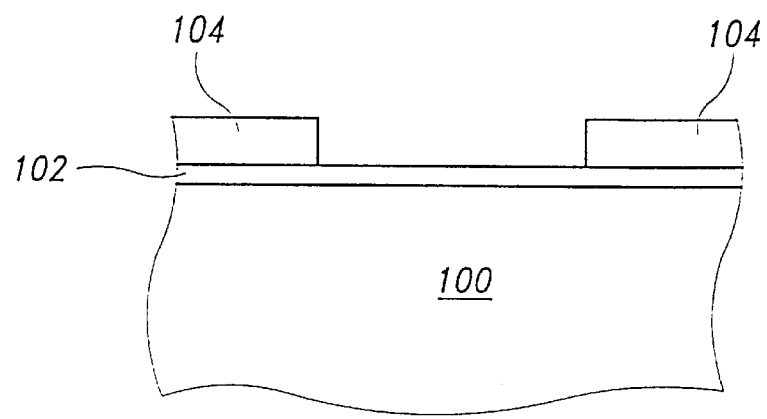
Figure 8C:
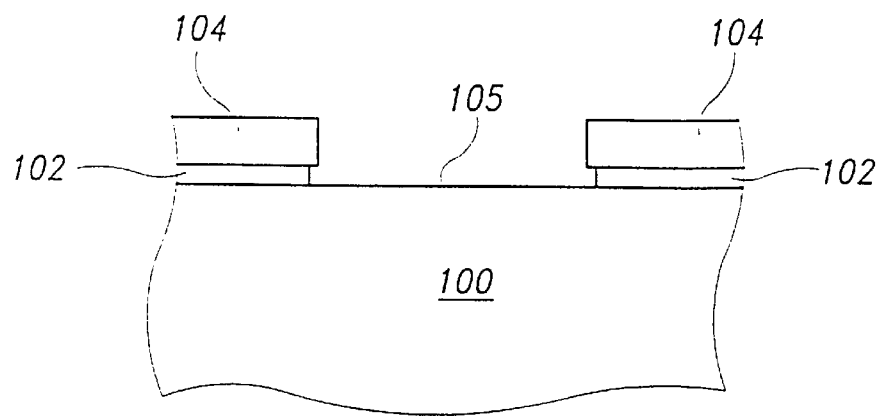
Figure 8D:
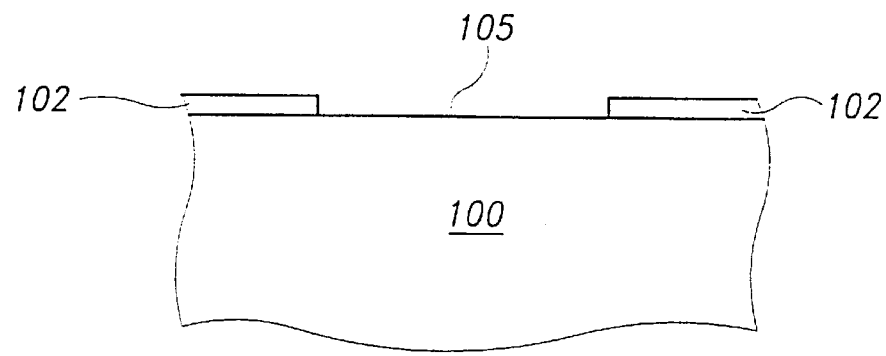

During the photolithography step (step 91 in FIG. 7), a photoresist 104 is deposited on the nitride layer 102, exposed to light and developed by using a photo mask (not shown). A pattern of the photoresist 104 is formed as shown in FIG. 8B. As shown in FIG. 8C, an opening 105 is formed by removing a part of the nitride layer 102, the part which is exposed to light by the pattern of the photoresist 104. At this time, the exposed part of the nitride layer 102 is etched by a dry or wet etch method. After removing the residues of the photoresist 104 from the silicon substrate (FIG. 8D, and step 93 in FIG. 7), the preoxidation cleaning is carried out (step 94 in FIG. 7). In the preoxidation cleaning step, LAL500, which contains $NH_4F$, HF, and $H_2O$, or standard cleaning solution 1, which contains $NH_4OH$, $H_2O$, and $H_2O_2$, is used as in the first embodiment.

Figure 8E:
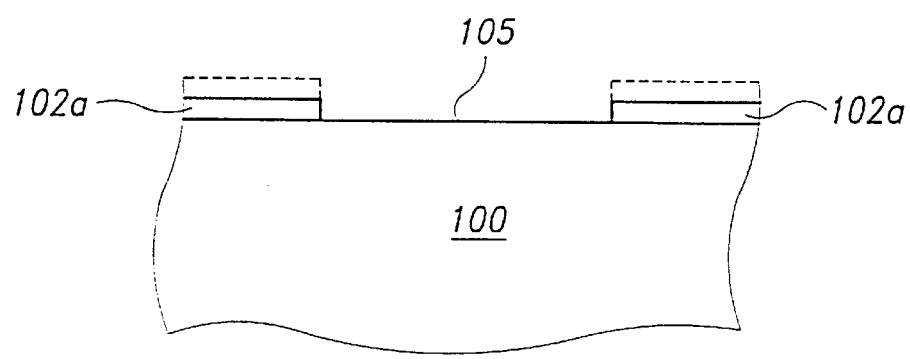

At this time, a silicon nitride layer 102a is formed by etching the nitride layer 102 as shown in FIG. 8E and the surface of the silicon substrate 100 which is exposed through the opening 105 is also etched. The surface of the silicon substrate 100 including the silicon nitride layer 102a is cleaned by the preoxidation cleaning, so that the thickness of the silicon nitride layer 102a is about 3 to 50 Å.

Figure 8F:
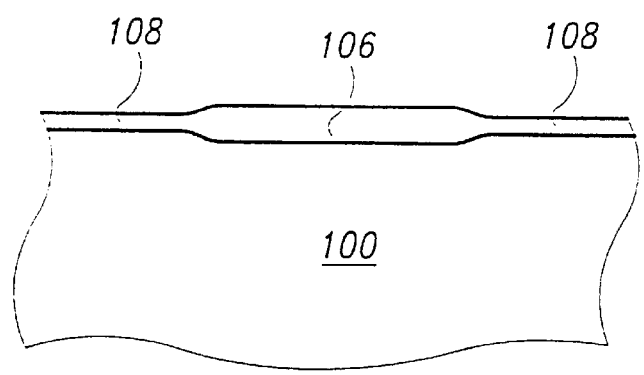

After the preoxidation cleaning, the oxidation process (step 95 in FIG. 7) is carried out. In the oxidation process, a thinner part 108 of the dual oxide layer is formed on the silicon nitride layer 102a and a thicker part 106 of the dual oxide layer is formed in the area of the opening 105 (FIG. 8F).

In the second embodiment of the present invention, the preoxidation cleaning step serves to uniformly etch the nitride layer as well as to clean the surface of the silicon substrate 100. For example, since LPCVD (Low Pressure Chemical Vapor Deposition) cannot form a very thin nitride layer of 20 Å or less, while maintaining uniformity in the thickness, it is difficult to use LPCVD in the actual manufacturing procedure. Therefore, if the nitride layer is etched by the wet etch method in the preoxidation cleaning step after depositing the nitride layer having the thickness of about 50 to 100 Å on the substrate, it is possible to form a thin nitride layer having excellent uniformity.

Since the nitride layer is etched at a very low etch rate, that is, 0.1 to 10 Å/min in the preoxidation cleaning step, the uniformity of the dual oxide layer within the wafer may be maintained. Table 2 shows the uniformity of the dual oxide layer within the wafer according to the thickness of the silicon nitride layer, which remains on the silicon substrate after the preoxidation cleaning step, and the oxidation method.

TABLE 2

Oxide Layer Uniformity Over Silicon Nitride Layer

| Oxidation Method | Thickness of Nitride Layer (Å) | Area 1 (Å) | Area 2 (Å) | Area 3 (Å) | Area 4 (Å) | Area 5 (Å) | Medium (Å) |
|---|---|---|---|---|---|---|---|
| Dry Oxidation | 10.7 | 48.3 | 54.5 | 33.7 | 46.8 | 55.0 | 47.7 |
| | 20.2 | 31.6 | 31.2 | 27.8 | 30.8 | 33.5 | 31.0 |
| | 25.8 | 32.4 | 32.2 | 30.5 | 32.2 | 33.0 | 32.1 |
| Pyrogenic Wet Oxidation | 11.6 | 352.7 | 345.8 | 341.3 | 350.0 | 349.1 | 347.8 |
| | 21.7 | 296.4 | 294.0 | 241.5 | 288.4 | 306.3 | 285.3 |
| | 28.0 | 83.7 | 79.7 | 59.7 | 72.2 | 98.2 | 78.7 |

In Table 2, the Areas (1–5) refer to five regions on the wafer. That is, Area 1 represents an uppermost region opposite the flat zone of the wafer, and Areas 2, 3, and 4 represent respectively a central left, a central, and a central right region of the wafer. Area 5 represents the region near the flat zone. Herein, the flat zone is the area of the wafer which is squared off to ease alignment and to simplify direction finding.

The dry oxidation uses $O_2$ under a thermal condition at a temperature of 900° C. so as to form an oxide layer 120 Å thick on the surface of the bare silicon substrate. On the other hand, the pyrogenic wet oxidation uses a thermal condition at a temperature of 850° C. so as to form an oxide layer 380 Å thick on the surface of the bare silicon substrate.

In the case of dry oxidation, when oxide layers were formed on the surface of wafers having remaining silicon nitride layer thicknesses of 10.7, 20.2, and 25.8 Å, the oxidized nitride layers formed had thicknesses of 47.7, 31.0, and 32.1 Å, respectively. However, in the case of the remaining silicon nitride layer with the thickness of 25.8 Å, it is estimated that the nitride layer was not throughly oxidized.

Meanwhile, in the case of pyrogenic wet oxidation, when oxide layers were formed on the surfaces of wafers having remaining silicon nitride layers with thicknesses of 11.6, 21.7, and 28.0 Å, the oxidized nitride layers formed had thickness of 347.8, 285.3, and 78.7 Å, respectively.

As can be seen from Table 2, the oxidation rates of the silicon nitride layers differ, depending upon the required oxidation of the nitride layer.

Figure 9:
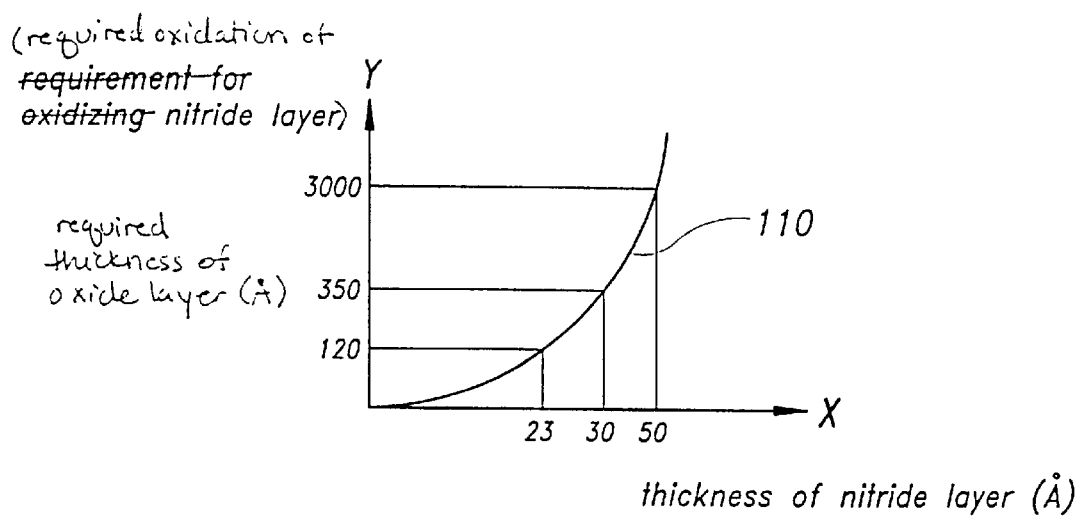
FIG. 9 is a graph showing a change of a requirement for oxidizing a nitride layer by the thickness of the nitride layer in the second embodiment of the present invention.

FIG. 9 is a graph showing how the required oxidation of the nitride layer varies with the thickness of the silicon nitride layer. In FIG. 9, the X-axis represents the thickness of the nitride layer and the Y-axis represents the required oxidation of the nitride layer. The required oxidation of the nitride layer is defined as the minimum oxidation required to thoroughly oxidize the nitride layer and is quantified in terms of the required thickness of the oxide layer to be formed on the silicon substrate or the bare wafer. As shown by the curve 110 in FIG. 9, for a nitride layer having a thickness of 23 Å (plotted on the X-axis), the required thickness of the oxide layer is 120 Å (plotted on the Y-axis). For a nitride layer having a thickness of 30 Å, the required thickness of the oxide layer is 350 Å, and for a nitride layer having a thickness of 50 Å, the required thickness of the oxide layer is 3,000 Å. Accordingly, a nitride layer more than 50 Å is difficult to oxidize throughly, and even if the nitride layer is oxidized, the value of $\Delta T_{OX}$ (i.e., the thickness difference between the thinner part and the thicker part of the dual oxide layer) is excessively great. Such a nitride layer may not be substantially usable in actual production. Therefore, it is preferable that the thickness of the remaining silicon nitride layer on the substrate be 50 Å or less after the preoxidation cleaning step.

Figure 10:
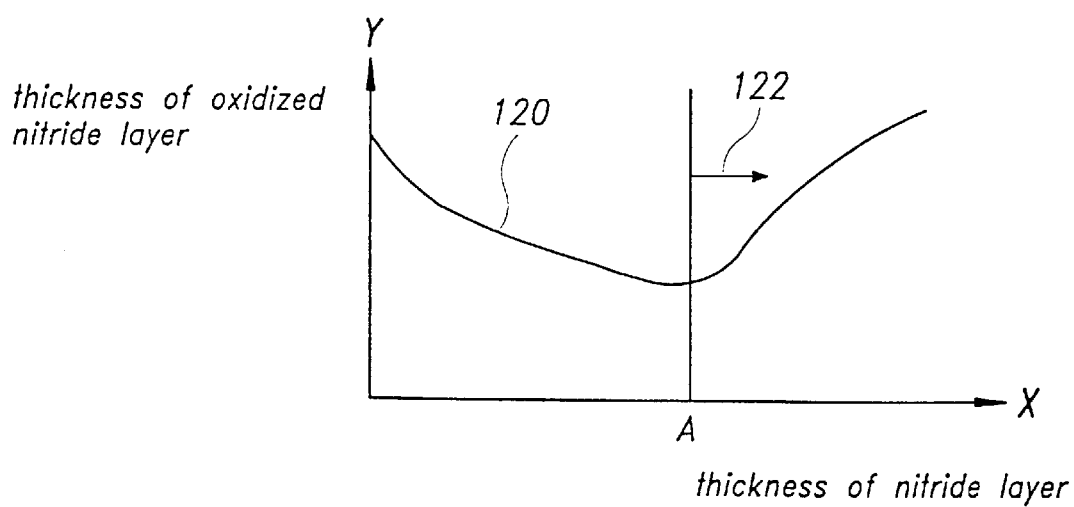
FIG. 10 is a graph showing a change of the thickness of an oxidized nitride layer by the thickness of the nitride layer in the second embodiment of the present invention.

FIG. 10 is a graph showing how the thickness of the oxidized nitride layer (Y-axis) varies with the thickness of the nitride layer (X-axis) in the second embodiment of the present invention. If the nitride layer having a thickness of 10.7 Å is oxidized so as to form an oxide layer having a thickness of 120 Å on the bare wafer, the oxidized nitride layer formed has a thickness of about 47.7 Å, and if the nitride layer having a thickness of 11.6 Å is oxidized so as to form an oxide layer having a thickness of 380 Å, the oxidized nitride layer formed has a thickness of about 347.8 Å. The thickness of the oxidized nitride layer, which is formed by the oxidation process, has a turning point 'A' as shown by the curve 120 of FIG. 10. A nitride layer of thickness less than that of the turning point 'A' would be throughly oxidized by the oxidation process, but a nitride layer of thickness falling within the region 122, that is having a thickness greater than that of the turning point 'A', would not be throughly oxidized. Accordingly, in the region of curve 120 to the left of the turning point 'A', the thickness of the nitride layer is inversely proportional to the thickness of the oxidized nitride layer. Meanwhile, in the region of curve 120 to the right of the turning point 'A', the thickness of the nitride layer is directly proportional to the thickness of the oxidized nitride layer. The location along the X-axis of the turning point 'A' varies according to the required thickness of the oxide layer on the bare wafer. For example, for a required oxide layer thickness of 120 Å, the turning point 'A' occurs at approximately 20 Å of the nitride layer thickness, and for a required oxide layer thickness of 380 Å, the turning point 'A' occurs at approximately 35 Å of the nitride layer thickness.

Although preferred embodiments of the present invention have been described in detail hereinabove, it should be clearly understood by those skilled in the art that many variations and/or modifications may be made, and equivalents may be substituted for elements thereof without departing from the true scope of the present invention. Therefore, it is intended that the present invention not be limited to the particular embodiment disclosed, but that the present invention include all embodiments falling within the scope of the appended claims.

What is claimed is:

1. A method of forming a dual oxide layer, the method comprising steps of:

depositing a nitride on a silicon substrate to form a nitride layer on the substrate;

removing one portion of the nitride layer to expose an area of the silicon substrate and leave another portion of the nitride layer adjacent said area;

subjecting said area of the substrate and said another portion of the nitride layer to a pre-oxidation cleaning process that cleans said area of the substrate and reduces the thickness of said another portion of the nitride layer;

subsequently simultaneously oxidizing the exposed area of the silicon substrate and said another portion of the nitride layer to produce a dual oxide layer that is thinner at the nitride layer than at the exposed area of the silicon substrate.

2. The method of forming a dual oxide layer of claim 1, wherein said removing of one portion of the nitride layer comprises depositing a photoresist on the nitride layer, and exposing the photoresist to light and developing the photoresist.

3. The method of forming a dual oxide layer of claim 1, wherein said depositing of a nitride comprises depositing silicon nitride on the silicon substrate to a thickness of about 50 to about 100 Å, and said oxidizing of the nitride layer forms an oxidized nitride as the thinner part of the dual oxide layer.

4. The method of forming a dual oxide layer of claim 3, wherein said pre-oxidation cleaning process comprises etching the nitride layer until the thickness thereof is less than 50 Å.

5. The method of forming a dual oxide layer of claim 3, wherein said pre-oxidation cleaning process comprises etching the nitride layer at a rate of 0.1 to 10 Å/min.

6. The method of forming a dual oxide layer of claim 4, wherein said pre-oxidation cleaning process comprises etching the nitride layer at a rate of 0.1 to 10 Å/min.

7. The method of forming a dual oxide layer of claim 1, wherein said pre-oxidation cleaning process comprises exposing said area of the silicon substrate and said another portion of the nitride layer to a first cleaning solution containing $NH_4F$, HF, and $H_2O$, and to a second cleaning solution containing $NH_4OH$, $H_2O$, and $H_2O_2$.

8. The method of forming a dual oxide layer of claim 1, wherein said pre-oxidation cleaning process comprises exposing said area of the silicon substrate and said another portion of the nitride layer to a first cleaning solution containing $NH_4F$, HF, and $H_2O$, and to a second cleaning solution containing $NH_4OH$, $H_2O$, $H_2O_2$ and HF.

* * * * *